United States Patent
Kuczera et al.

(10) Patent No.: US 10,060,761 B2
(45) Date of Patent: Aug. 28, 2018

(54) SAFETY MAT FOR SAFEGUARDING A TECHNICAL INSTALLATION

(71) Applicant: Pilz GmbH & Co. KG, Ostfildern (DE)

(72) Inventors: Matthias Kuczera, Ostfildern (DE); Onedin Ibrocevic, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 0 days.

(21) Appl. No.: 15/335,782

(22) Filed: Oct. 27, 2016

(65) Prior Publication Data

US 2017/0146368 A1    May 25, 2017

(30) Foreign Application Priority Data

Nov. 25, 2015   (DE) .................. 10 2015 120 369

(51) Int. Cl.
| | |
|---|---|
| *G01R 27/08* | (2006.01) |
| *G01D 5/16* | (2006.01) |
| *H03K 17/96* | (2006.01) |

(52) U.S. Cl.
CPC ........... *G01D 5/16* (2013.01); *H03K 17/9645* (2013.01)

(58) Field of Classification Search
CPC .. G01D 5/16; H01H 1/06; H01H 3/14; H01H 3/141; H01H 2203/008; H01H 2003/147;

(Continued)

(56) References Cited

U.S. PATENT DOCUMENTS

| | | | |
|---|---|---|---|
| 5,047,602 A | 9/1991 | Lipka | |
| 5,798,703 A * | 8/1998 | Sakai | F16P 3/12 307/119 |

(Continued)

FOREIGN PATENT DOCUMENTS

| | | |
|---|---|---|
| DE | 2 138 919 | 2/1973 |
| DE | 100 46 974 A1 | 10/2001 |

(Continued)

OTHER PUBLICATIONS

DIN EN ISO 13856-1; Safety of machinery—Pressure-sensitive protective devices—Part 1: General principles for the design and testing of pressure-sensitive mats and pressure-sensitive floors; Aug. 2013; 60 pp.

(Continued)

*Primary Examiner* — Thang Le
(74) *Attorney, Agent, or Firm* — Harness, Dickey & Pierce, P.L.C.

(57) ABSTRACT

Safety mat for safeguarding a technical installation, comprising a sensor, a rigid supporting body and an evaluation unit. The sensor has an active sensor area and a flexible connection region for contacting the sensor area. The flexible connection region is formed at a border of the active sensor area. The supporting body has a base with a top side and a side face which adjoins the said top side. The evaluation unit is arranged in the interior of the supporting body below the active sensor area and is configured to generate an output signal depending on the actuation of the active sensor area. The active sensor area covers the top side of the base of the supporting body completely, and the connection region of the sensor is folded around the side face through 180° and guided into the interior of the supporting body.

14 Claims, 9 Drawing Sheets

(58) Field of Classification Search
CPC .... H03K 17/9645; H02G 9/025; H01R 13/04; H01R 13/10; F16P 3/12; G05B 19/0425; G08B 13/10; G08B 21/22
See application file for complete search history.

(56) References Cited

U.S. PATENT DOCUMENTS

| | | | |
|---|---|---|---|
| 6,155,120 A | 12/2000 | Taylor | |
| 7,413,374 B2* | 8/2008 | Rogers | E01C 9/086 404/35 |
| 2004/0253861 A1 | 12/2004 | Schubert et al. | |
| 2005/0075545 A1* | 4/2005 | Honda | A61B 1/00039 600/301 |
| 2006/0082465 A1* | 4/2006 | Grzan | H01H 3/141 340/665 |
| 2009/0065344 A1* | 3/2009 | Pehrson | H01H 3/141 200/514 |
| 2009/0134318 A1 | 5/2009 | Kuniyoshi et al. | |
| 2011/0279276 A1* | 11/2011 | Newham | A61B 5/1115 340/573.4 |
| 2012/0139719 A1* | 6/2012 | Garcia | F24C 7/08 340/538 |
| 2012/0323501 A1 | 12/2012 | Sarrafzadeh et al. | |

FOREIGN PATENT DOCUMENTS

| | | |
|---|---|---|
| EP | 0 398 844 A2 | 11/1990 |
| FR | 2.033.046 | 12/1970 |
| JP | 5307086 | 11/1993 |
| JP | 2001255221 A | 9/2001 |
| JP | 2004330370 A | 11/2004 |
| JP | 2006284404 A | 10/2006 |
| JP | 2007078382 A | 3/2007 |
| JP | 201051359 A | 3/2010 |
| JP | 2011050757 A | 3/2011 |
| JP | 2015169532 A | 9/2015 |
| WO | WO-9701773 A1 | 1/1997 |
| WO | WO-2004066194 A1 | 8/2004 |

OTHER PUBLICATIONS

DIN EN 61076-2-104; Connectors for electronic equipment—Product requirements—Part 2—104: Circular connectors—Detail specification for circular connectors with M8 screw-locking or snap-locking (IEC 48B/2305/CD:2012); Sep. 2012; 65 pp.
European Search Report for EP 16 19 5660; dated Apr. 4, 2017; 5 pp.

* cited by examiner

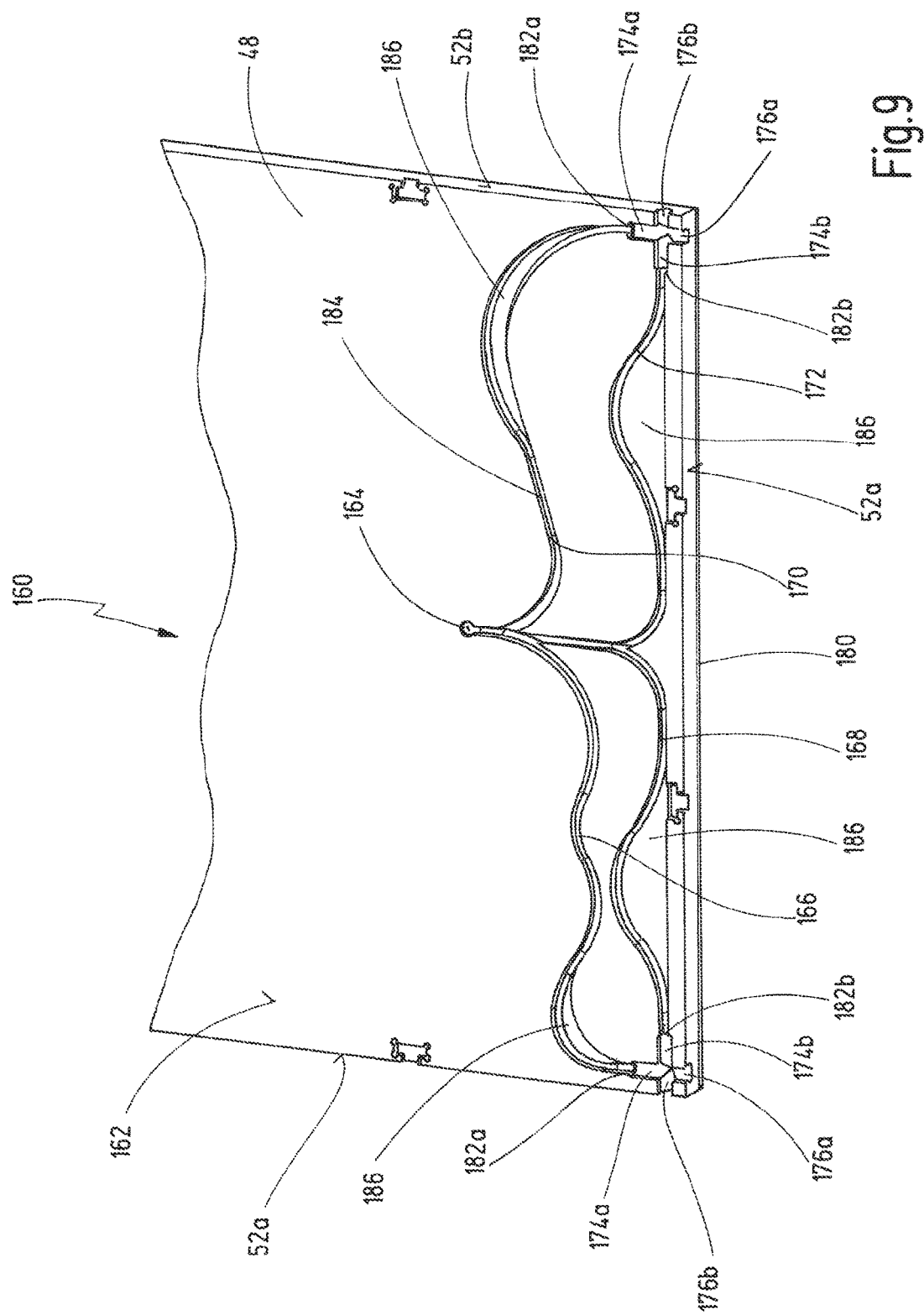

SAFETY MAT FOR SAFEGUARDING A TECHNICAL INSTALLATION

CROSS-REFERENCES TO RELATED APPLICATIONS

This application claims priority from German patent application DE 10 2015 120 369.3, filed Nov. 25, 2015. The entire content of this priority application is incorporated herein by reference.

BACKGROUND OF THE INVENTION

The present disclosure relates to a safety mat for monitoring a technical installation.

As automation of production processes has increased, the requirements in respect of reliable safety of industrial production installations have continuously increased. For example, revised EC Machinery Directive of 17 May 2006 describes a standard safety level for preventing accidents which is to be taken into consideration when a machine is placed on the market or put into service. Accordingly, technical installations, machines and robots may be commissioned only in conjunction with corresponding safety measures. These measures include, in particular, monitoring hazardous regions of a technical installation and moving the technical installation to a state which is safe for persons and objects in the event of unauthorized access to the hazardous region.

So-called pressure or switching mats, as are described in DE 100 46 974 B4 for example, are known from the prior art for identifying the presence of persons. Safety mats of this kind are generally composed of two current-carrying plates which are separated from one another and which are held at a distance from one another by strip- or grid-like spacers. If a person steps on the safety mat, the plates and spacers deform until a cross-connection is formed between the plates. The cross-connection can be detected by measurement and causes a connected safety relay module to switch off the technical installation or to prevent said technical installation from starting up.

This simple sensor system is disadvantageous in many respects. In particular, the size of the safety mat is dependent on the plate size and therefore cannot be extended as desired. Furthermore, the sensitivity of a safety mat of this kind is not homogeneous and varies over the surface area. As indicated in DE 100 46 974 B4, safety mats of this kind generally exhibit their normal sensitivity in the central regions, whereas identification functions only inaccurately or not at all in the border regions. As a result, the safety mats also cannot be lined up with one another in any desired manner in order to protect a relatively large region since large regions in which reliable detection cannot be ensured form at the transitions between the safety mats by virtue of border regions coming together.

Finally, the single safety mat generally does not allow spatially resolving identification. That is to say, it only identifies that the safety mat has been stepped on, but does not identify the region of the safety mat in which this has taken place. However, when monitoring relatively large and relatively complex installations, it would be desirable to distinguish between different hazardous regions in order to allow targeted control of the installation in the event of a hazard. However, this requires an improved sensor system for safety mats.

SUMMARY OF THE INVENTION

It is an object of the present invention to provide a safety mat which avoids the abovementioned disadvantages. It is a further object to provide a safety mat which can be extended, in particular in a modular manner. Yet it is a further object to provide a safety mat which allows reliable identification even in the border regions.

According to one aspect of the present disclosure there is provided a safety mat for safeguarding a technical installation, comprising a sensor, a rigid supporting body and an evaluation unit, wherein the sensor has an active sensor area and a flexible connection region for contacting the sensor area, the flexible connection region being formed at a border of the active sensor area, wherein the supporting body has a base with a top side and a first side face which adjoins the said top side, wherein the evaluation unit is arranged in the interior of the supporting body below the active sensor area and is configured to generate an output signal depending on the operation of the active sensor area, wherein the active sensor area completely covers the top side of the base of the supporting body, and wherein the connection region of the sensor is folded around the first side face through 180° and guided into the interior of the supporting body.

It is therefore an idea to separate the sensor system and the housing structure of a safety mat from one another. This has the advantage that the effective surface area of the safety mat is dependent on the arrangement of the sensor on the housing and not on the housing itself. Therefore, the sensor is not dependent on the structure of the housing either and can be designed in any desired manner. A flexible, tactile sensor which is arranged on the supporting body is advantageously used, so that the active sensor area substantially completely covers a surface of the supporting body. The active sensor area is the area of the sensor which is touch-sensitive in order to detect a mechanical load. The active sensor area is also called the effective operating area of the safety mat. A connection region adjoins the active sensor area, said connection region likewise being of flexible design and being foldable beneath the active sensor area. Electrical contact can be made with the active sensor surface by means of the connection region, while the active sensor area itself advantageously does not have any further electrical connections.

The connection region is connected to the evaluation unit which is advantageously arranged beneath the active sensor surface in the interior of the supporting body owing to the folded-over connection region. Therefore, evaluation of the sensor and generation of a fail-safe output signal are performed completely within the safety mat. Therefore, the effective area of the safety mat is not influenced by the design of the evaluation unit nor of the electrical connections and is solely dependent on the arrangement of the active sensor area on the supporting body. The active sensor area advantageously substantially completely covers a top side of the supporting body, wherein the top side preferably forms a continuously effective area of the safety mat. The effective area can be extended as desired by further safety mats being attached to the safety mat in order to form a composite of safety mats, the surfaces of said safety mats combining to form a preferably seamless composite of active sensor areas.

Separating the sensor and the housing further has the advantage that the supporting body can be of rigid and robust design since the supporting body itself does not contribute to the functioning of the sensor, but rather merely provides a support for the said sensor. A continuously rigid and inflexible design of the supporting body can advantageously ensure homogeneous sensitivity over the entire effective area, as a result of which the reliability of identification is increased. Furthermore, on account of its rigid supporting body, the safety mat can advantageously be used in regions with soft or uneven flooring since these regions are compensated for by the rigid supporting body, without influencing the sensitivity of the safety mat.

Finally, the design allows the electrical components, in particular the evaluation unit and the electrical contact-connection to said evaluation unit, to be arranged in the interior of the supporting body such that they are protected. Therefore, a sensor with a high international protection marking, for example IP67, can be realized in a simple manner.

Therefore, the object cited at the outset is achieved in full.

In a preferred refinement, cavities are provided in the connection region, and the first side face has a profile with groove-like cavities, wherein the cavities engage in the profile when the connection region is folded around the first side face. This refinement has the advantage that the connection region is fixed to the supporting body, and that a force which acts on the active sensor surface is transmitted past the connection region to the base and the rigid supporting body and therefore does not subject the folded-over connection region to loading. In this way, the electrical structures which are located in the connection region are particularly well protected against the pressure loads, as a result of which the service life of the sensor is increased.

In a further preferred refinement, the active sensor surface is produced from a flexible material, and the connection region is an extension of the active sensor surface, which extension is composed of the same material. This refinement has the advantage that the connection region and the active sensor surface of the sensor are composed substantially of the same material and therefore can preferably be produced from one piece. Therefore, production of the sensor is particularly simple and cost-effective. Furthermore, no additional components, such as electrical connectors for example, are required for making contact with the active sensor surface.

In a further preferred refinement, the sensor has a first layer with electrodes in a first orientation, a second layer with electrodes in a second orientation, and a third layer which is situated between the first and the second layer. This refinement has the advantage that a sensor with a large number of sensor cells, which allow a spatially resolving sensor, can be formed in a simple manner. The sensor cells are formed in the regions in which the electrodes of the first layer overlap with the electrodes of the second layer. A sensor cell is therefore a layer system comprising two electrodes and a layer which is situated between the said two electrodes and which determines the electrical properties of a sensor cell. The design as a matrix-like sensor has the advantage that, in a preferred refinement, it is possible to identify not only loading of the entire safety mat but also to determine the sensor cell at which the loading has occurred. Therefore, the safety mat can also be used for relatively complex applications which require spatial resolution.

In a particularly preferred refinement, the first and the second layer are a flexible woven fabric into which the electrodes are woven with conductive yarn. This refinement has the advantage that the sensor can be of particularly lightweight and flexible design. The fabric-like design allows a low overall height of the safety mat, in spite of the additional supporting body. The fabric-like flexibility of the sensor also allows the connection region of the sensor to be folded around the side face of the supporting body with a close fit. Therefore, the folded-over connection region does not widen the safety mat in relation to the dimensions of the entire safety mat and allows a seamless transition of the active sensor areas between adjacent safety mats.

In a particularly preferred refinement, the third layer is formed from flexible conductive material which, under local loading, changes its specific electrical resistance at the site of the loading. Owing to the flexible conductive material, a sensor with spatial resolution can be formed in a particularly simple manner since a large number of sensor cells can be formed using one material, the electrical property of the said sensor cells being dependent on local loading. Therefore, the individual cells do not have to be produced as individual pieces, but rather are advantageously created by joining the first and the second layer, as carrier material for the electrodes, and the third layer for determining the electrical properties of a cell.

In a further preferred refinement, the connection region is subdivided into a first and a second region, and the base has a further side face, wherein the first region is folded around the first side face, and the second region is folded around the further side face. This refinement has the advantage that, in the case of a matrix-like arrangement of the electrodes in rows and columns, contact can be made with the electrodes of the rows in a first connection region and contact can be made with the electrodes of the columns in a second connection region. Contact can be made with the electrodes of the sensor in a particularly simple manner in this way. Furthermore, the first and the second layer can be designed in a substantially identical manner.

In a further preferred refinement, the electrodes of the first layer are extended into the first region, and the electrodes of the second layer are extended into the second region. This refinement has the advantage that contact can be made with the electrodes in the respective regions and the electrodes of the columns and of the rows of the matrix-like sensor can first be combined within the carrier housing. Therefore, the active sensor surface can be formed solely from the electrodes, without additional structures for combining the electrodes of the columns and of the rows. Combination can then advantageously take place by means of cable connection within the supporting body.

In a further preferred refinement, the connection region is formed only on one side of the active sensor surface, and the electrodes of the first layer and of the second layer are guided into the connection region. Therefore, this constitutes an alternative to the abovementioned refinement. The refinement has the advantage that the connections of the sensor are concentrated on one side of the sensor and contact can be made with the electrodes of both layers on one side. Connection between the evaluation unit and the electrodes of the sensor can therefore be made particularly easily at a single point, without additional cabling being required in the interior of the supporting body.

In a further preferred refinement, the first layer has intermediate regions, which space apart the electrodes from one another, and further conductive paths with the first orientation, which are arranged in the intermediate regions and contact the electrodes of the second layer, wherein the electrodes of the first layer and the further conductive paths are guided into the connection region. This refinement has the advantage that contact can also be made with the electrodes of the second layer in the first layer in a simple manner. The further conductive paths are similar to the electrodes and are arranged in the intermediate regions between the electrodes of the first layer. The further conductive paths can be created in the same way as the electrodes of the first layer, wherein the further conductive paths are preferably several times narrower than the electrodes of the first layer.

In a further advantageous refinement, the active sensor area is larger than 0.25 m², preferably between 0.25 m² and 1 m². The refinement has the advantage that regions of large surface area can be covered in a particularly simple manner by interconnecting a plurality of safety mats.

In a further preferred refinement, the connection region is folded around the first side face with a deflection radius of from 0.3 cm to 1 cm. The refinement has the advantage that the safety mat can be designed with a low height.

In a further advantageous refinement, the safety mat has a cover plate on which the active sensor surface is arranged, wherein the cover plate is arranged on the supporting body in a releasable manner, in order to allow access to the evaluation unit. The cover plate is designed in the manner of a cover which is fitted onto the supporting body and closes an interior space in which the evaluation unit and further electronic components of the safety mat can be arranged. The refinement has the advantage that the sensor and the supporting body can be easily separated from one another, as a result of which handling and servicing of the safety mat are simplified.

It goes without saying that the abovementioned features and those still to be explained below can be used not only in the respectively indicated combination but also in other combinations or on their own without departing from the scope of the present invention.

BRIEF DESCRIPTION OF THE DRAWINGS

FIG. 9 is a perspective illustration of a preferred exemplary embodiment of a rear side of a novel safety mat.

DESCRIPTION OF PREFERRED EMBODIMENTS

Figure 1:
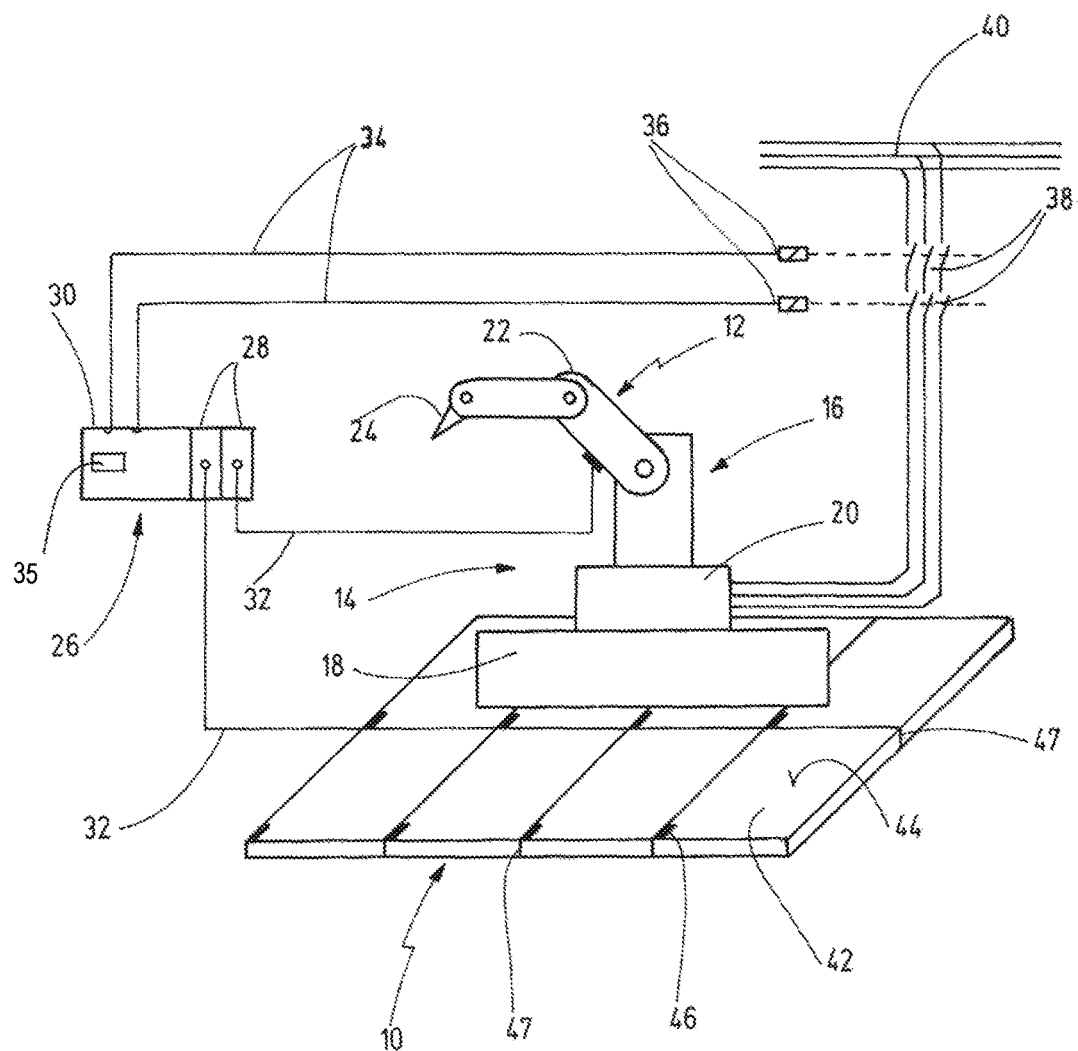
FIG. 1 is a schematic illustration of possible fields of application of exemplary embodiments of the novel safety device.

In FIG. 1, a first pressure-sensitive safety device and a second pressure-sensitive safety device are identified overall by reference numerals 10 and 12. The first and the second pressure-sensitive safety device serve to protect a technical installation 14 which is specified here as a robot 16 which operates in an automated manner. The robot 16 may be, for example, a cutting or welding robot in a production or assembly line.

The robot 16 is mounted on a holder 18 and can be rotated about its own axis by a drive 20. Furthermore, the robot 16 has a robot arm 22 which has a tool 24 at its end. The rotation and pivot region of the robot arm 22 defines an action region of the robot 16, which at the same time corresponds to a hazardous region of the robot 16. Entry into this region—both unauthorized and authorized—has to be identified so that the robot can be moved to a state which is not hazardous to persons. Here, the identification process is performed by the pressure-sensitive safety devices 10 and 12 which are coupled to a safety system 26. The safety system 26 can be an output signal switching device within the meaning of EN ISO 13856-1, for example a simple safety switching device, a configurable safety controller or else a programmable control unit. The safety system 26 is configured to move the technical installation 14 into a state which is not hazardous to persons, for example by the technical installation being switched off.

FIG. 1 shows a modular safety system 26 which has input modules 28 and an output module 30. The input modules 28 are coupled to the pressure-sensitive safety devices 10, 12 via lines 32. In the present exemplary embodiment, the output module 30 is connected to contactors 36 via a redundant line 34, the operating contacts 38 of the said contactors 36 being arranged in a power supply 40 of the electric drive 20. A processing unit 35 drives the contactor 36, in order to switch off the robot 16 in the event of a hazard, depending on the signals from the pressure-sensitive safety devices 10, 12, which are applied to the input modules 28. It goes without saying that switching off the technical installation 14 is only one possible option of moving the technical installation to a safe state. As an alternative or in addition, in another exemplary embodiment, the safety system 26 can also influence control of the movement of the robot 16 in order to establish a safe state, for example by having the robot 16 retract the robot arm 22. Further, it is likewise feasible for the processing unit 35 to take into account the combined signals from the first pressure-sensitive safety device 10 and the second pressure-sensitive safety device 12 or any further safety devices in order to make a decision about how to drive the robot 16 based on joint consideration. Further safety devices can be, for example, non-contact safety devices (BWS) such as light barriers or light grids, or else a safety camera system.

In the exemplary embodiment according to FIG. 1, the first pressure-sensitive safety device 10 is a safety mat, in particular a switching mat within the meaning of EN ISO 13856-1, which is laid on the floor around the holder 18 of the robot 16. In this exemplary embodiment, the safety mat is modular and comprises eight safety mat modules 42 forming two rows each comprising four modules. Each safety mat module 42 comprises a sensor with an active sensor area 44 and an evaluation unit 46. The active sensor area 44 is pressure-sensitive, as will be explained in greater detail with reference to the following figures. The evaluation unit 46 is configured to register a load on the pressure-sensitive active sensor area 44 and to provide an output signal depending on the said load. The evaluation unit 46 can be a digital or analog circuit, a microcontroller, a FPGA, an ASIC or any other signal-processing unit.

In this exemplary embodiment, the output signal from the evaluation unit 46 is a signal which can indicate a first state and a second state. A safe state is preferably indicated by an active output signal (always on). Particularly preferably, the output signal is an OSSD signal, i.e. a redundant signal with two clock signals which are not synchronized with one another. The output signals from the individual evaluation units 46 can be transmitted individually or in a combined manner to the input module 28 of the safety system 26 via the line 32. If there is no output signal at all or the output signal does not reach the input module 28 in the expected form, the above-described safety function is executed by the safety system 26 and the technical installation 14 is switched off by the contactor 36.

The safety mat which is composed of the individual safety mat modules 42 comprises a substantially continuous sensor surface which is formed from the individual active sensor areas 44 of the safety mat modules 42. In this regard, substantially continuous means that safety-relevant identification can also take place in the transition regions of adjacent safety mats and the passive boundary regions are correspondingly minimized. In the exemplary embodiment according to FIG. 1, a safety mat module 42 has a cuboidal supporting body with an extended base. The base has a top side and rear side which have a large surface area in comparison to the side faces. The active sensor area 44 of the safety mat modules 42 completely covers the top side of the base. The effective operating area of the safety mat module therefore extends virtually over the entire surface of the safety mat module 42. In a combination of a plurality of safety mat modules, the effective operating area extends as far as the butt joints 47 between two adjacent safety mat modules 42, in order to form a virtually seamless operating area of the safety mat. In one exemplary embodiment, the supporting body additionally has a narrow border which surrounds the base to fasten a further protective layer onto this border in order to achieve a particularly high International Protection Marking (IP67).

In order to identify actuation of the safety mat, the evaluation units 46 of the individual safety mat modules 42 are also combined to a compound. This preferably takes place beneath the active sensor areas 44 in the interior of the safety mat modules 42 or on the rear side of the said safety mat modules. In one exemplary embodiment, the evaluation units 46 are connected in series, wherein the first or last evaluation unit 46 of the chain is connected to the input module of a safety system. The series circuit is designed such that, as soon as there is no output signal from an evaluation unit 46, an actuation of the entire safety mat is signalled to a safety system connected thereto. However, in other exemplary embodiments, a different combination of the individual evaluation units 46, for example a master and slave composition, and also different signal processing are feasible. Therefore, in one exemplary embodiment, the detected values may be directly passed on by the individual evaluation units 46 to the safety system which independently decides how the actuation of a safety mat module is to be assessed.

In the exemplary embodiment according to FIG. 1, the technical installation 14 is arranged on the safety mat and the effective surface. In other preferred exemplary embodiments, the safety mat is arranged around the holder 18 of the technical installation 14. If the installation is positioned on the effective surface, the safety mat or the individual safety mat modules have to be configured such that a region on which the technical installation 14 is positioned can be blanked out. In other words, the safety mat has to be of spatially resolving design in order to identify which regions of the active sensor area have been actuated. By means of the spatial resolution, individual regions on which the technical installation 14 is positioned can remain unevaluated.

In the exemplary embodiment according to FIG. 1, the second sensor 12 likewise comprises an active sensor surface 44 and an evaluation unit 46 which is connected to an input module 28 of the safety system 26 via a line 32. The active sensor area 44 of the second sensor 12 is arranged on a surface of the technical installation 14, here in particular on the robot arm 22. The active sensor surface 44 is flexible and matches the contour of the surface of the technical installation 14. As in the case of the safety mat, a plurality of active sensor areas 44 may be combined to form a composite in this exemplary embodiment, in order to increase the size of the effective operating area. Preferably, the part of the robot which is moving in space is completely covered by the active sensor surface 44.

In the exemplary embodiment according to FIG. 1, the robot arm 22 has two cylindrical components, the active sensor surface 44 being arranged on the cylindrical surface of the said cylindrical components. In contrast to the first sensor 10, the second sensor 12 is designed not to monitor access to the technical installation 14 but rather to detect an object or a person getting in contact with the robot arm 22. As in the case of the first sensor 10, the evaluation unit 46 of the second sensor generates an output signal, based on which the safety system 26 is able to control, in particular switch off, the robot 16. The technical design of the first and the second sensor 10, 12 will be explained in greater detail with reference to the following figures. Identical reference symbols denote identical parts.

Figure 2:
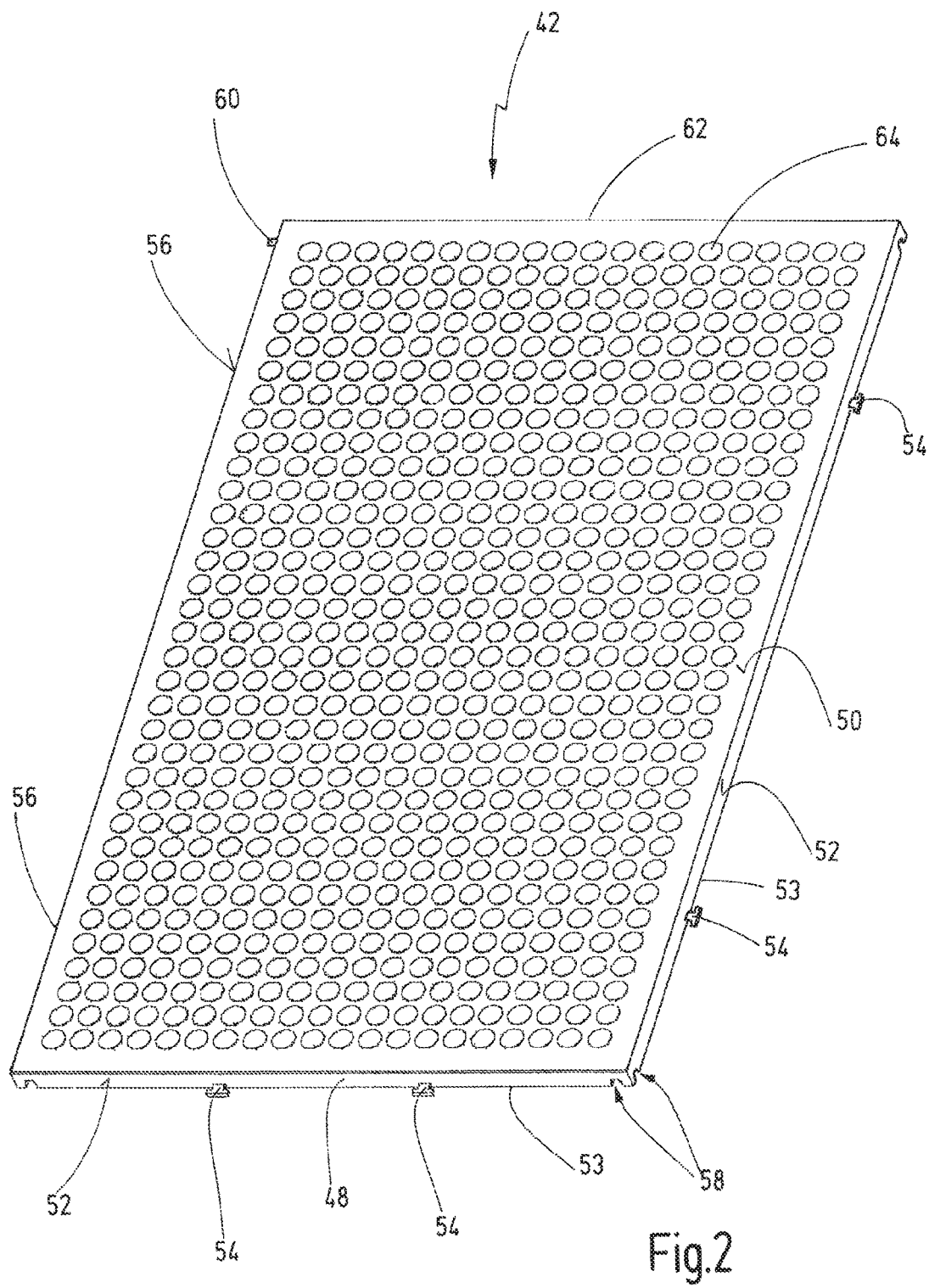
FIG. 2 is a perspective illustration of an exemplary embodiment of a novel safety mat.

FIG. 2 is a perspective illustration of an exemplary embodiment of a safety mat module 42 of the first pressure-sensitive safety device 10 shown in FIG. 1. The safety mat module 42 has a rigid supporting body 48 with a planar surface 50 of large surface area and narrow side faces 52 perpendicular to the surface 50. In the exemplary embodiment according to FIG. 2, the planar surface 50 is rectangular and the safety mat module 42 is cuboidal overall, so that the surface 50, the rear side and the side faces 52 are arranged orthogonally to one another. It goes without saying that in other exemplary embodiments other forms are feasible. In particular, a triangular, diamond-shaped or hexagonal form of the surface are conceivable, that is to say in particular forms with which a surface can be filled without gaps (parqueted).

In the exemplary embodiment according to FIG. 2, the safety mat module 42 is 60 cm wide and 1 m deep and 3 cm high. The surface 50 preferably has an area of between 0.25 $m^2$ and 1 $m^2$. These dimensions are particularly suitable for laying the safety mat modules 42 like normal tiles. In the present exemplary embodiment, T-shaped connecting elements 54 are arranged on the bottom of two side edges 53 of the safety mat module, which protrude perpendicularly from the safety mat module 42. On the side edges which are situated opposite the two side edges 53 receptacles 56 which are situated opposite of the connecting elements 54 are arranged. The receptacles 56 are T-shaped cavities on the rear side of the supporting body 48 corresponding to the connecting elements 54, so that two adjacent safety mat modules 42 can lie flush against one another and can be fixed by the receptacles 56 and the connecting elements 54 engaging one in the other. It goes without saying that in other exemplary embodiments other connecting means are conceivable. For example, in one exemplary embodiment, the connecting elements can be separate components with a double-T-shaped contour which are inserted into the receptacles 56 as required. In another exemplary embodiment, U profiles, for example composed of aluminium, can also be used for holding the safety mat modules together.

In the exemplary embodiment according to FIG. 2, further cavities are arranged in the side faces 52, wherein in at least one of these cavities 58 a plug connector 60 for making electrical contact with an adjacent safety mat module 42 is arranged. A plug (not illustrated here) which fits the plug connector 60 can be arranged in a further cavity 58. An evaluation unit of the safety mat module 42 is arranged within the supporting body 48 (likewise not visible here). The evaluation unit can be connected to a safety system or else to a further evaluation unit of an adjacent safety mat module 42 by the plug and plug connector 60. In one exemplary embodiment, each switching mat requires a termination plug. Preferably, the plug connector 60 can be arranged in different cavities 58, wherein cavities 58 are preferably provided in all of the corner regions of the safety mat module 42. Thereby, the safety mat can be combined to an assembly in a particularly simple and flexible manner.

In the present exemplary embodiment, the planar surface 50 is completely covered by an elastic rubber mat 62, for example a mat which is composed of polyurethane, so that the sensor which is situated beneath said mat is hidden. The rubber mat 62 is preferably fixed on the planar surface 50 and on the transitions of the side faces 52 such that water, dust and other impurities cannot enter the interior of the supporting body 48. The rubber mat 62 and the supporting body 48 are particularly preferably configured such that the safety mat module 42 complies with international protection class IP67. The same applies for the plug and the plug connector 60. The active sensor area and also the evaluation unit of the safety mat are arranged beneath the rubber mat 62, which has here nubs 64 on its surface, in order to minimize the risk of slipping. The pressure-sensitive active sensor area extends beneath the rubber mat 62 over the entire planar surface 50 of the base of the supporting body 48 and defines the active region of the safety mat module 42. In one exemplary embodiment, the active region extends over the entire planar surface 50 of the supporting body 48. It goes without saying that an individual safety mat module 42 can be used as an independent safety mat, without being part of an assembly.

Figure 3:
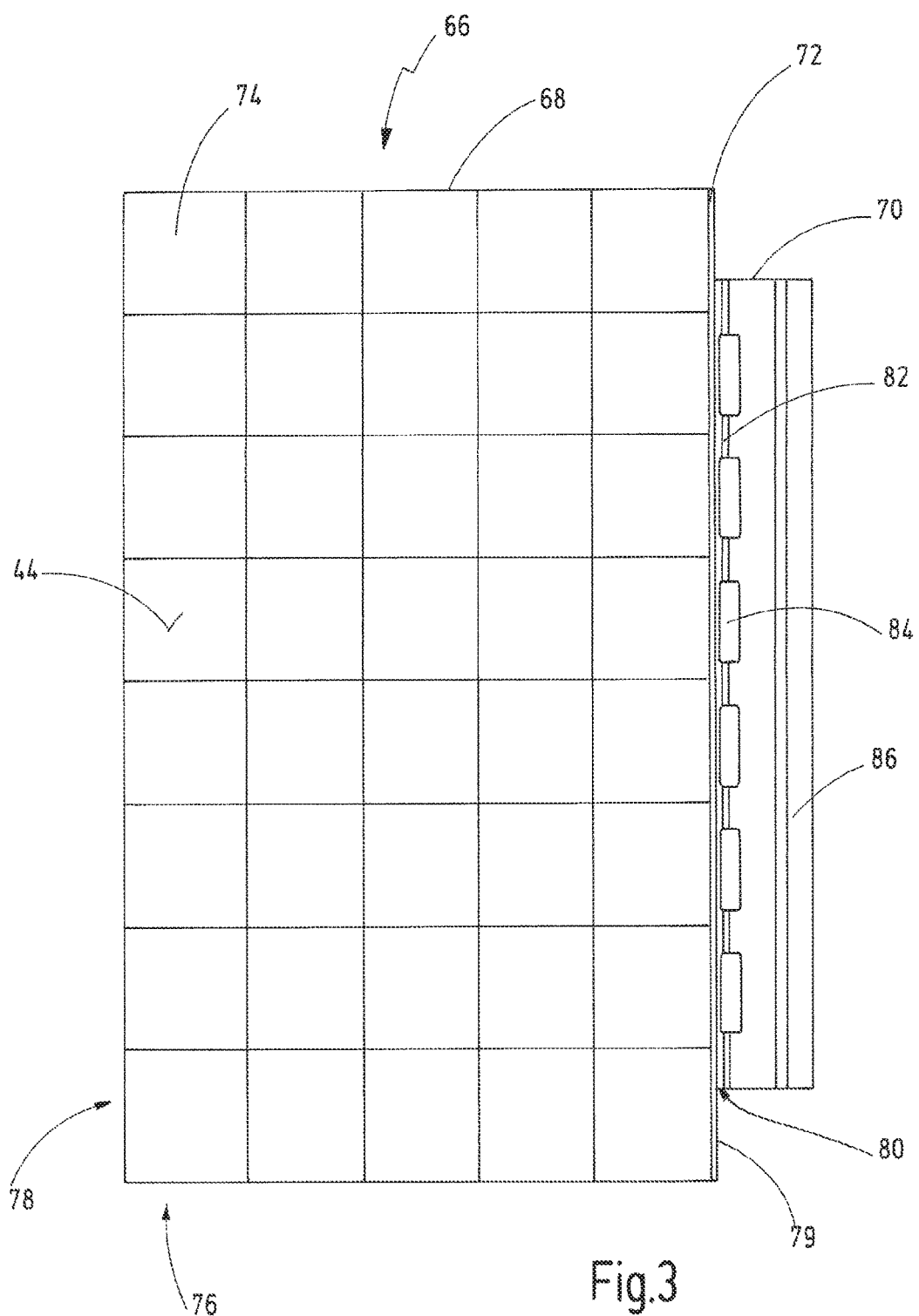
FIG. 3 shows an exemplary embodiment of a sensor of the novel safety mat.

FIG. 3 shows a preferred exemplary embodiment of a sensor 66 for a safety mat module 42. In addition to a matrix-like sensor arrangement 68 which forms the active sensor area 44, the sensor 66 has a connection region 70 for connecting the sensor arrangement 68 to an evaluation unit. The sensor arrangement 68 and the connection region 70 of the sensor 66 are manufactured from a common carrier material 72. The carrier material 72 is preferably a flexible, textile-like woven fabric into which electrical structures are woven. The electrical structures in the fabric are created by the use of conductive and non-conductive yarn. The carrier material 72 is so flexible that it can be rolled up and folded like any fabric. In addition to the carrier material 72, the sensor arrangement 68 has a further fabric-like material which substantially determines the pressure-sensitive properties of the sensor arrangement 68.

The sensor arrangement 68 is formed from the carrier material 72, the electrical structures on the carrier material 72 and the pressure-sensitive material. The electrical structures form individual sensor cells 74 which are arranged in rows 76 and columns 78 in a matrix-like manner. The mechanical load can be determined for each sensor cell 74, in order to determine an overall pressure distribution over the sensor arrangement 68 and therefore over the active sensor area 44, as will be explained in even greater detail with reference to FIG. 4.

In this exemplary embodiment, the connection region 70 is formed on a side edge 79 of the sensor arrangement 68. In other exemplary embodiments, the connection region 70 can also be formed on a plurality of side edges of the sensor arrangement 68. The connection region 70 is an extension of the carrier material 72 and the electrical structures thereon. In other words, the sensor arrangements 68 and the connection region 70 are manufactured substantially from one piece. The connection region 70 is likewise of flexible design. The connection region 70 can be folded along a kink edge 80 which runs along the side edge 79 of the sensor arrangement 68 at the transition to the connection region 70. The connection region 70 is configured to be placed around the kink edge 80, that is to say the connection region 70 can be folded under the sensor arrangement 68 around the kink edge 18. In FIG. 3 the unfolded sensor is shown.

The connection region 70 can extend over the entire length of a side edge 79 of the sensor arrangement 68 or, as in the exemplary embodiment according to FIG. 3, only over a subregion of the side edge 79. The connection region 70 has cavities 84 in a fold-over region 82 which starts from the side edge 79. The fold-over region 82 extends from the kink edge 80, over the entire length of said kink edge, preferably 1 to 2 cm into the connection region 70. The cavities 84 are passage openings in the connection region 70 and are arranged on a straight line parallel to the kink edge 80. The cavities 84 are preferably rectangular, slot-like cavities in the carrier material 72 which are arranged in the fold-over region 82.

The connection region 70 further has a contact-making region 86. Contact can be made with the electrical structures in the contact-making region 86 in order to be able to establish an electrical connection to an evaluation unit. Preferably, insulated cables are woven into the carrier material 72 in the contact-making region 86, wherein the insulation of the cables has been removed at those points at which contact is intended to be made with the electrical structures. This can be performed, for example, by subsequently removing the insulations of the cables at precise points with a laser. The sensor arrangement 68 and the electrical connection thereof are explained in greater detail in FIG. 4.

Figure 4:
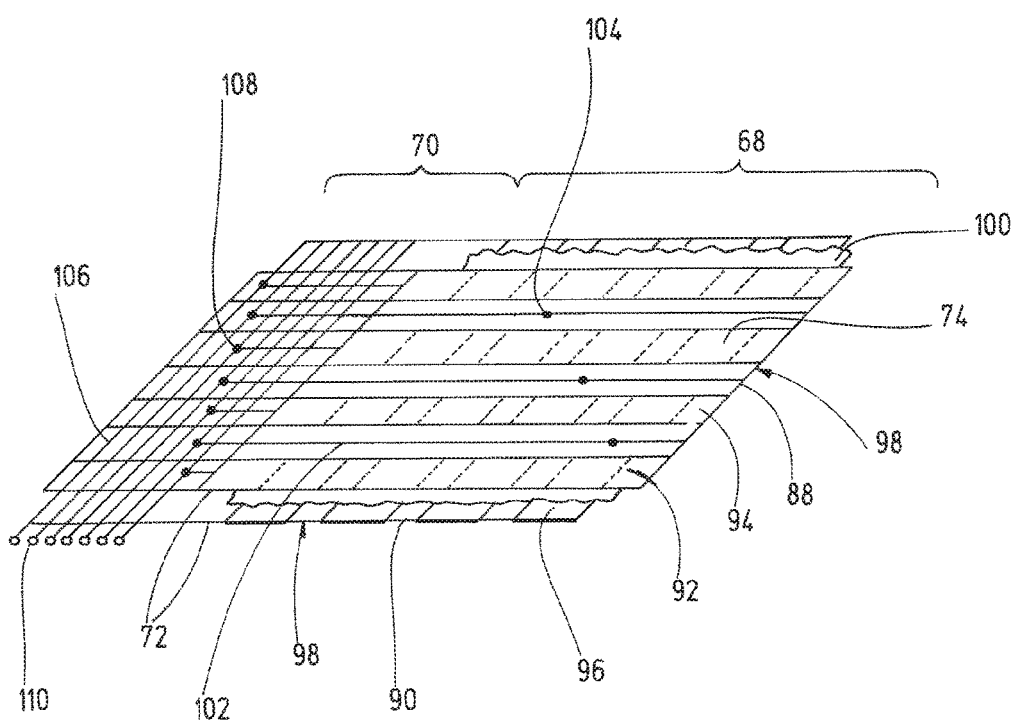
FIG. 4 is a schematic illustration of a further exemplary embodiment of a sensor.

FIG. 4 is a schematic illustration of an exemplary embodiment of a sensor arrangement 68 and also the electrical connection thereof in a connection region 70. The sensor arrangement 68 has a first layer 88 and a second layer 90, which are each manufactured from the carrier material 72. Electrical structures, as described above, are arranged on the first layer 88 and the second layer 90. The electrical structures of the first and the second layer 88, 90 are formed from strip-like electrodes 92, 94, 96. The electrodes of the respective layer are arranged parallel to one another and are spaced apart by insulating intermediate regions 98. The first layer 88 and the second layer 90 are preferably manufactured from one piece which is divided into two parts after manufacture, wherein the two parts are placed above one another and rotated by 90° in relation to one another to form the matrix-like sensor arrangement 68.

A further layer 100 which is composed of pressure-sensitive material is arranged between the first layer 88 and the second layer 90. The further layer 100 is preferably composed of a non-woven, conductive fabric. Particularly preferably, the further layer 100 is a non-woven microfibre cloth which is coated with a conductive coating. The pressure-sensitive material of the further layer 100 is configured such that, when it is mechanically loaded, it changes the electrical properties between two opposite electrodes.

The sensor cells 74 of the sensor arrangement 68 are formed in the overlap regions (illustrated using dashed lines here) of the electrodes 92, 94 of the first layer 88 and the electrodes 96 of the second layer 90. It goes without saying that the other electrodes of the first and the second layer form further sensor cells 74. Therefore, contact can be made with each sensor cell 74 by an electrode of the first layer 88 and an electrode of the second layer 90. The pressure-sensitive material of the further layer 100, which pressure-sensitive material determines the electrical properties of the sensor cell 74 when it is mechanically loaded, is arranged between the electrodes of a sensor cell 74. The electrical property of a sensor cell 74 is preferably determined by the specific electrical resistance of the sensor cell 74 which can be measured using the electrodes of the sensor cell 74. A change in the specific electrical resistance due to a mechanical load on the sensor cell 74 can arise in various ways. For example, in one exemplary embodiment, when the further layer is mechanically loaded, the specific electrical resistance of the said further layer changes at the site of the loading. In another preferred exemplary embodiment, the change in resistance due to a load is caused by a change in the contact area from the electrodes of the first and the second layer 88, 90 to the conductive material of the further layer 100. That is, the first and the second layer with the electrodes 92, 94, 96 adapt under pressure to the rough, conductive material of the further layer 100 and as a result of which the size of the contact area is increased and the resistance falls. Alternatively, a change in resistance is caused by a change in geometry of the conductive material of the further layer 100 as a result of mechanical loading.

In a further exemplary embodiment, the pressure-sensitive material is an electrically non-conductive flexible material which is in the form of a sieve and deforms under mechanical loading, so that the first and the second electrode of the first layer can partially get in contact with the third electrode in the second layer in the region of the mechanical loading. The electrical resistance of a sensor cell is then dependent on the elasticity, the size and the shape of the sieve-like grid. The electrical resistance of a sensor cell is then determined by the number of times the electrodes which are spaced apart by the pressure-sensitive material make contact. The greater the number of contact points resulting from the mechanical loading of the pressure-sensitive material in the region of a sensor cell, the lower the electrical resistance of the sensor cell.

Preferably, the electrodes 92, 94 of the first layer 88 and the electrodes 96 of the second layer 90 are contacted on one side of the sensor arrangement 68. As described above, contact is made in a connection region 70 which is formed from an extension of the carrier material 72 of the first and/or of the second layer. In the exemplary embodiment according to FIG. 4, both the carrier material 72 of the first layer 88 and the second layer 90 are extended into the connection region 70. However, only the electrodes of the first layer 88 are extended into the connection region 70 here as well as further conductive paths 102 which are arranged parallel to the electrodes in the intermediate regions 98 of the first layer 88. The conductive paths 102 are woven into the carrier material 72, like the electrodes 92, 94. The conductive paths 102 can extend over the entire width of the first layer 88, like the electrodes 92, 94. Furthermore, the sensor arrangement 68 has through connections 104 which electrically connect the further conductive paths 102 to the electrodes 96 of the second layer 90. Like the electrodes, the through connections 104 are composed of conductive yarn, but are routed orthogonally to the first and the second layer from the first layer 88, through the further layer 100, to the second layer 90.

Insulated cables 106 which run perpendicular to the electrodes 92, 94 of the first layer 88 and the further conductive paths 102 are arranged in the connection region 70. The insulation of the cables 106 is removed at individual contact points 108, so that an electrical connection can be made between the electrodes 92, 94 of the first layer or one of the further conductive paths 102 and the insulated cables 106 at these points. The insulated cables 106 are routed out of the carrier material 72 on one side of the connection region 70 and provided with connections 110, for example in the form of a connector strip. The insulated cables 106 and therefore the electrodes 92, 94, 96 of the first and the second layer 88, 90 can be connected to an evaluation unit (not illustrated here), which can determine by the connections 110 the resistances within the sensor cells 74.

Figure 5:
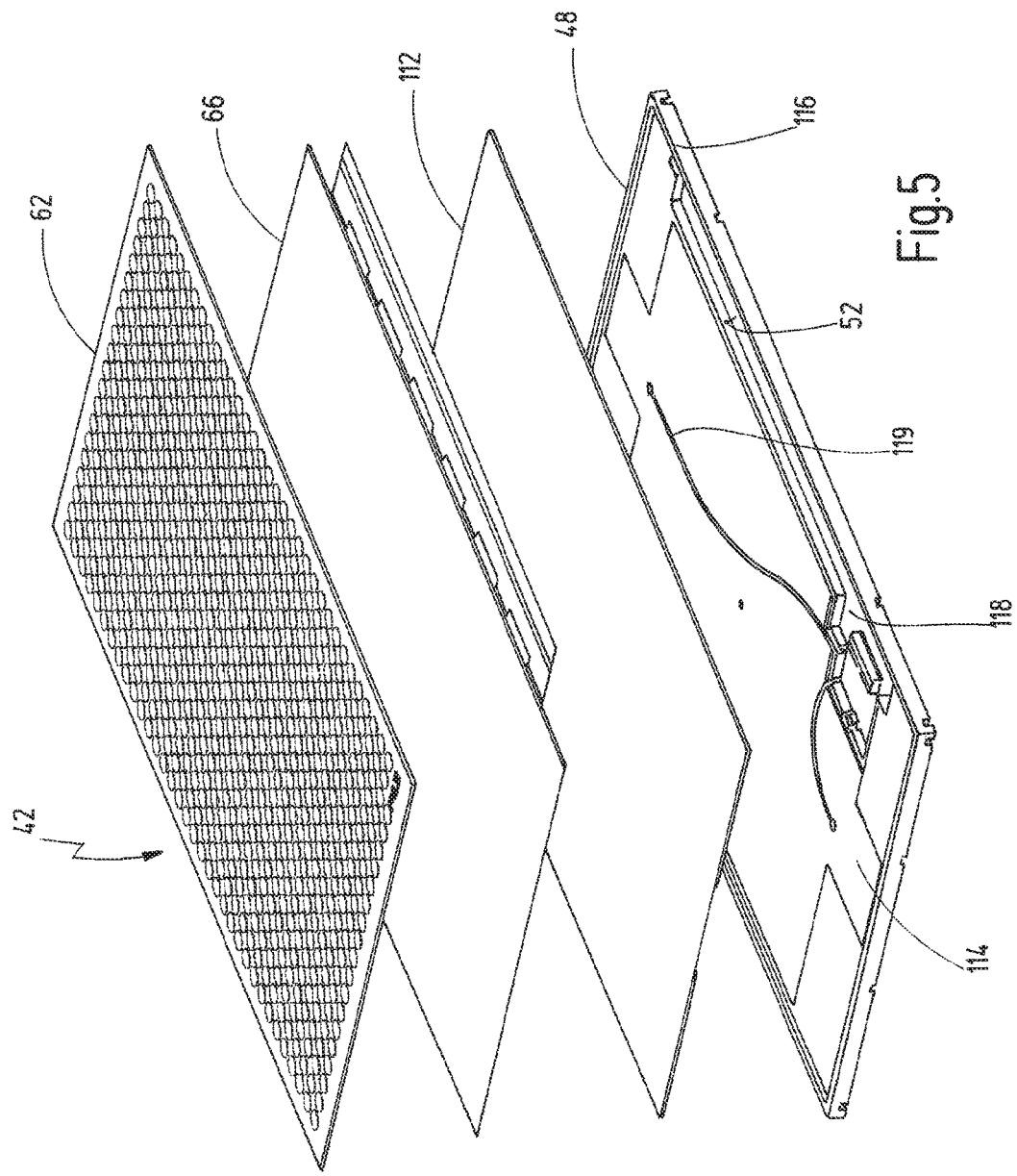
FIG. 5 is an exploded assembly drawing of an exemplary embodiment of a novel safety mat.
Figure 6:
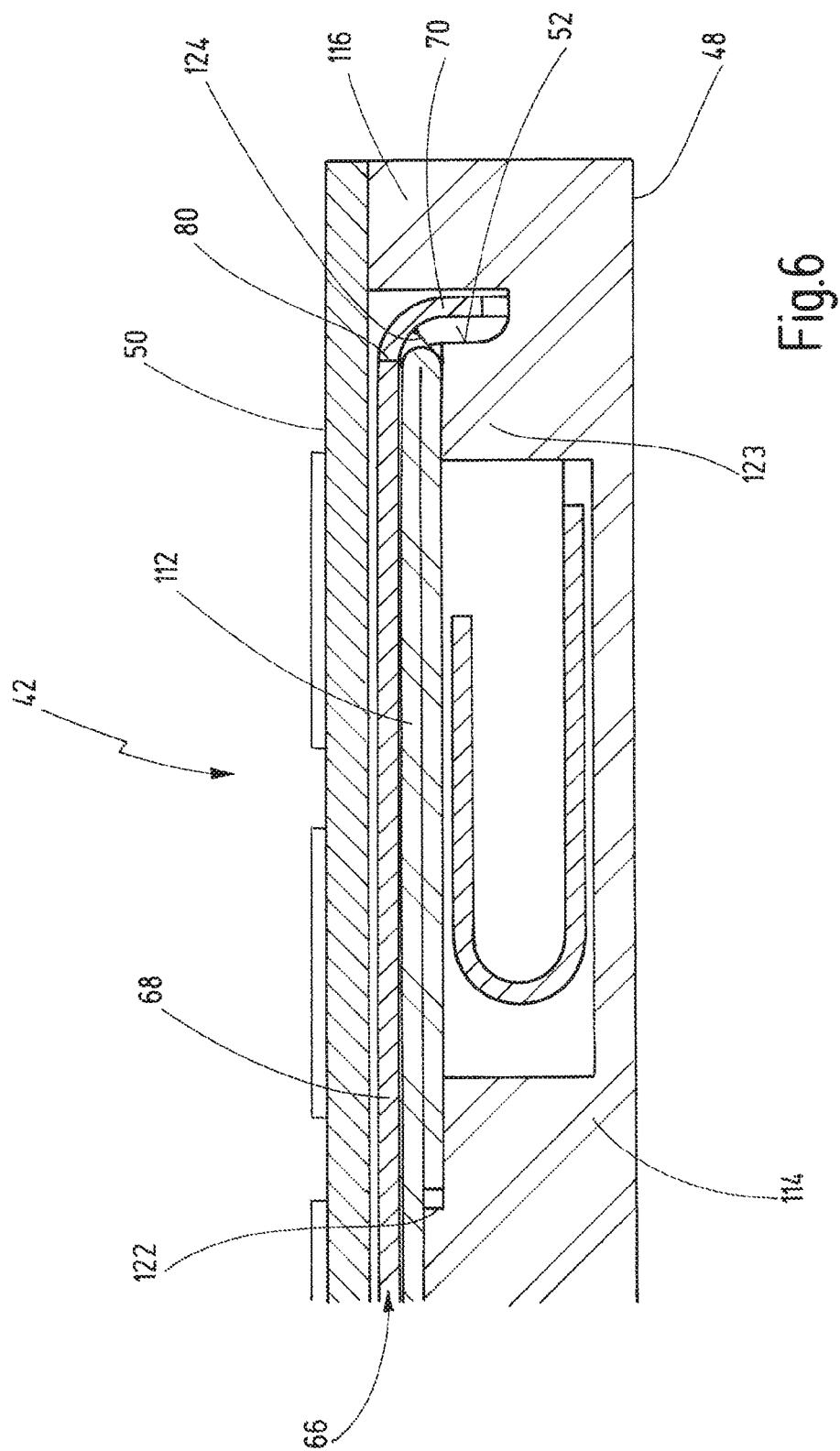
FIG. 6 shows a sectional drawing of an exemplary embodiment of a novel safety mat.

FIGS. 5 and 6 show a preferred exemplary embodiment of a safety mat module 42 in an exploded assembly drawing and in a sectional drawing. Once again, identical reference numbers denote identical parts.

FIG. 5 shows the layered composition of the safety mat module 42. The first level forms the slip-resistant rubber mat 62 beneath which the sensor 66 is arranged. The sensor lies on a cover plate 112 which is configured to be inserted into the supporting body 48. The cover plate 112 is dimensioned such that it is completely covered by the sensor arrangement 68 of the sensor 66, while the connection region 70 of the sensor 66 protrudes beyond the cover plate 112. The connection region 70 likewise protrudes beyond the rubber mat 62. Therefore, in an assembled state, the rubber mat 62, the cover plate 112 and the sensor arrangement 68 form a layered assembly, from which the connection region 70 protrudes.

In this preferred exemplary embodiment, the supporting body 48 has a base 114 with a circumferential, protruding border 116. The cover plate 112 and the sensor arrangement 68 lie on the supporting body. The cover plate 112 is fixed on the supporting body 48 in a force-fitting or cohesive manner by a plurality of adhesion points having a diameter and depth as bores in the supporting body selected such that on the one hand different thermal expansion characteristics can be compensated for and on the other hand the tensile forces of the adhesive layer do not lead to a deforming of the safety mat due to a change in temperature. In another exemplary embodiment, the cover plate 112 can also be fixed to the border 116 by an interlocking connection. Furthermore, the cover plate 112 can have one or more press-in bolts and the supporting body 48 can have corresponding bores in order to orient the cover plate 112 with respect to the supporting body 48.

The rubber mat 62 extends beyond the cover plate 112 and the sensor arrangement 68 to such an extent that the top side of the border 116 is also covered by the rubber mat 62. Thereby, the cover plate 112 and the sensor arrangement 68 are embedded, preferably in a water- and dust-tight manner, within the supporting body 48 by the rubber mat 62 being adhesively bonded to the top side of the border 116. Structures 118 in form of cavities are incorporated into the base 114, in which the electronics of the safety mat module 42, for example the evaluation unit, are being arranged. The structures 118 can furthermore have cavities for cable harness 119 in order to connect the electronics to the outside.

FIG. 6 depicts a cross section of the safety mat module 42 across the kink edge 80 of the sensor 66. The sensor arrangement 68 lies on top of a cover plate 112 which, in turn, lies on top of the supporting body 48. The cover plate 112 can be a rigid metal plate which, in this exemplary embodiment, is folded at a one side by 180° and the folded section engages into a fold in the supporting body 48 in an interlocking manner in order to fix the metal plate on the supporting body. The connection region 70 is folded over a side face 52, which is perpendicular to the surface 50, in a radius 124. The radius 124 is preferably between 0.2 cm and 1 cm. During the folding, a protrusion 123 of the supporting body 48 which supports the cover plate 112 is guided through the cavity 84 in the connection region. Thereby, a force which is applied perpendicularly to the surface 50 does not affect the connection region 70, but is rather released past the connection region 70 through the protrusion 123 onto the supporting body 48. Therefore, the connection region 70 is not subjected to loading when a person steps onto the surface.

In the preferred exemplary embodiment according to FIG. 6, the supporting body 48 additionally comprises a border 116 around the supporting body. The slip-resistant rubber mat 62 is placed onto the border 116, so that the interior of the supporting body 48 is sealed. In another exemplary embodiment, the sensor arrangement 68 and the cover plate 112 may extend over the border, so that the connection region 70 is folded over the border 116 and guided into the interior of the supporting body 48. In this case, the border 116 has a groove-like profile into which the cavities 84 of the connection region 70 can engage, so that a force which applied onto the surface 50 is also released past the connection region 70.

Figure 7:
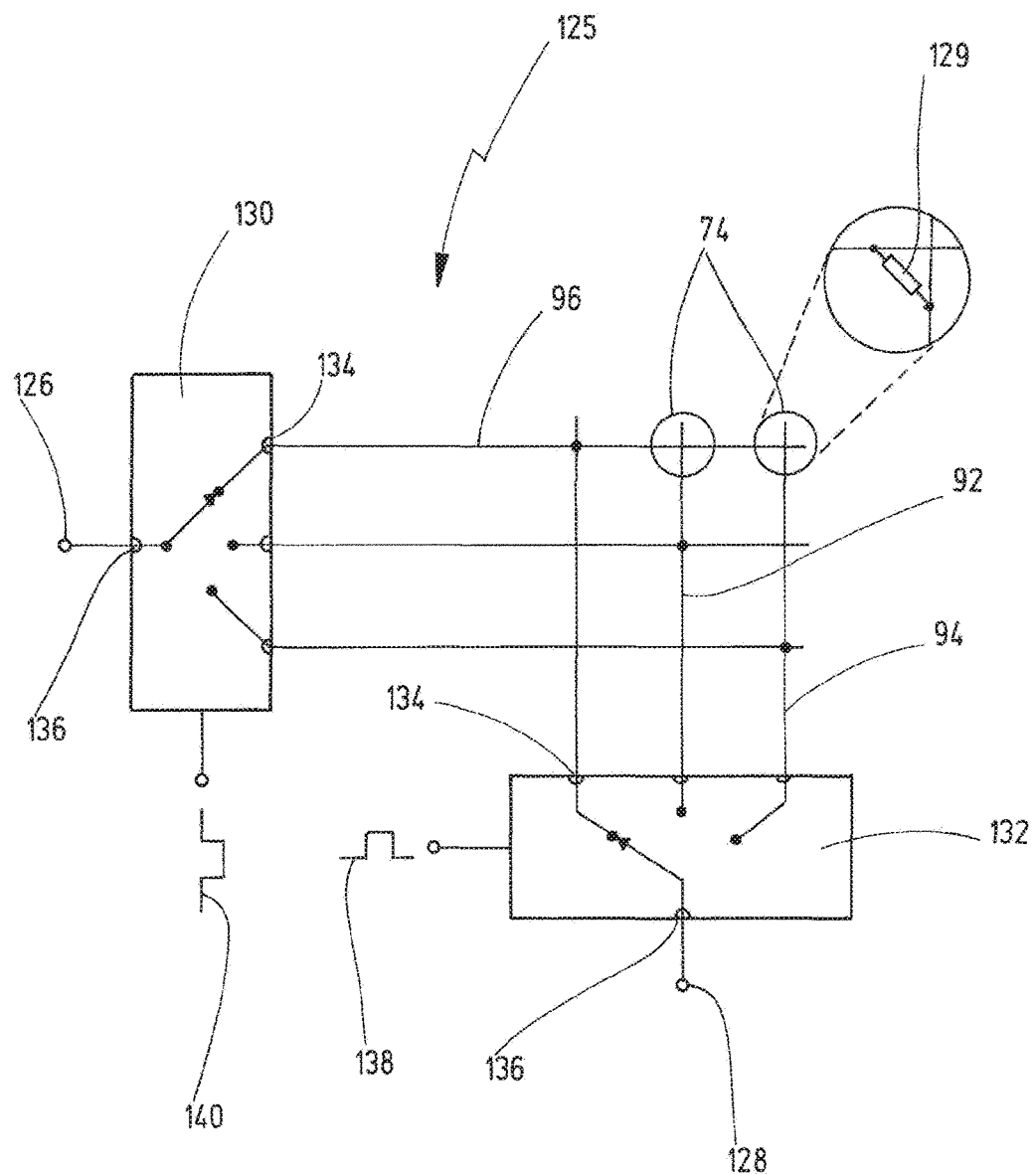
FIG. 7 is a schematic illustration of an exemplary embodiment of a connection circuit of a sensor.
Figure 8:
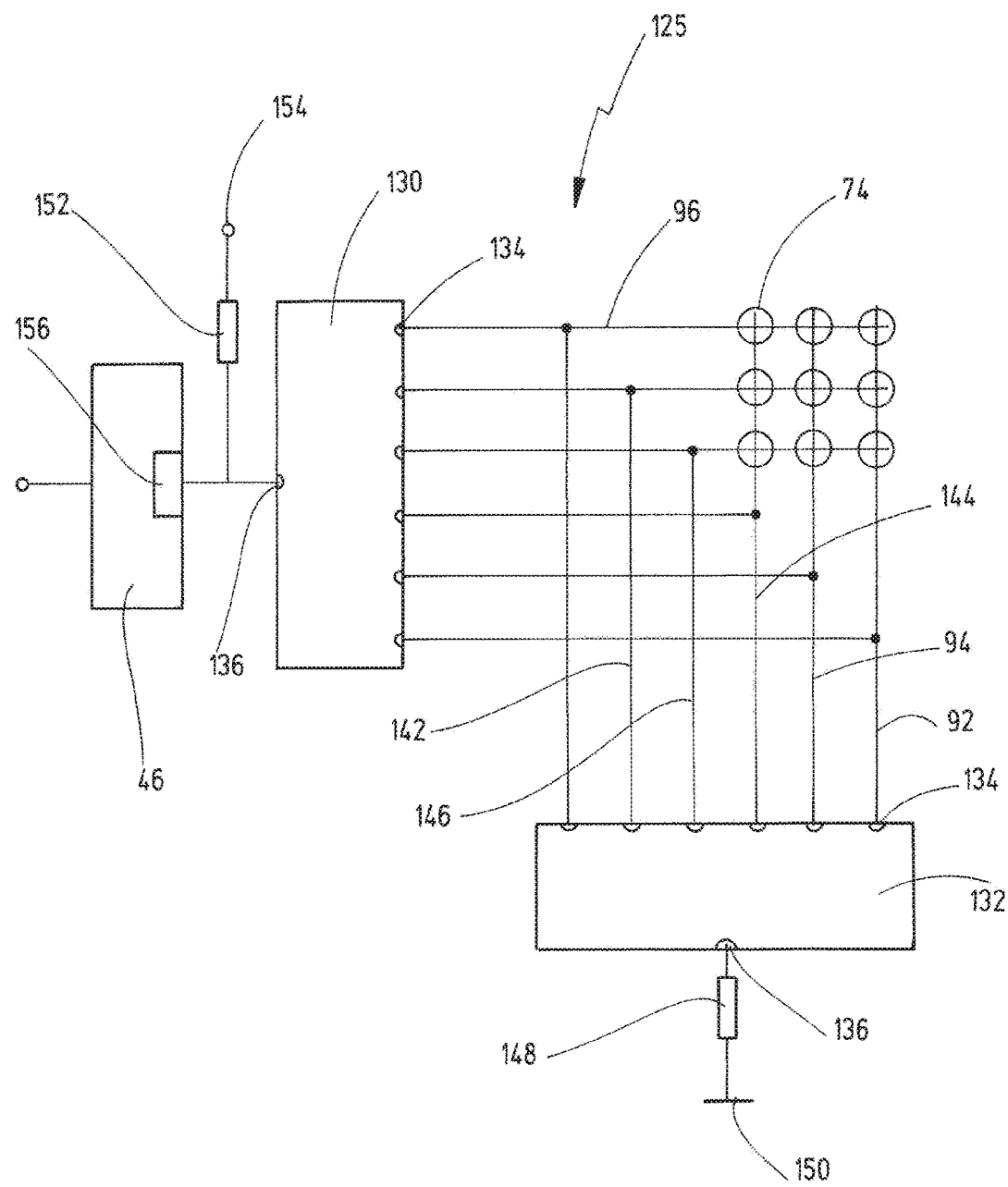
FIG. 8 is a schematic illustration of a preferred exemplary embodiment of a connection circuit of a sensor.

FIGS. 7 and 8 show two schematic illustrations of exemplary embodiments for contacting the sensor 66.

FIG. 7 shows a first and a second sensor cell 74 that can be connected to an evaluation unit (not illustrated here) by a circuit arrangement 125 having a first and a second terminal 126, 128. The sensor cells 74 are formed from a first electrode 92, a second electrode 94 and a third electrode 96. Between the electrodes of a sensor cell 74 a resistance 129 can be determined which, as explained above, is dependent on the mechanical load applied to the sensor cell 74.

The electrodes 92, 94, 96 are connected to a first sequentialization element 130 and a second sequentialization element 132. The first and the second sequentialization element 130, 132 are configured to combine a large number of connection terminals to a single connection terminal 126, 128. The sequentialization elements 130, 132 are preferably data switches, so-called multiplexers. A sequentialization element 130, 132 has a large number of inputs 134 and a single output 136. In a sequentialization element 130, 132, one output 136 is always connected to one of the inputs 134 at a specific time. A sequentialization element 130, 132 can be single, preferably integrated electronic device, or a combination of multiple individual switching device which are coupled together in order to form a single sequentialization element. Switching between the individual inputs 134 of the sequentialization elements 130, 132 is performed by an external trigger 138, 140. The external trigger 138, 140 can be provided directly by the evaluation unit or can be provided by an external clock signal. In the latter case, the cycle of the external trigger 138 of the second sequentialization element 132 is preferably one factor greater than the cycle of the external trigger 140 of the first sequentialization element 130. The ratio is selected such that the first sequentialization element 130 connects a first input of the inputs 134 to the output 136, while the second sequentialization element during the same time connects all of its inputs 134 at least once to the output 136. This way, all of the sensor cells 74 can be tested in succession in a simple manner by the respective electrodes being connected to the outputs 136 of the first and the second sequentialization element 130, 132 by the said sequentialization elements.

The first and the second sequentialization element 130, 132 are over-occupied at their inputs 134, i.e. the first sequentialization element 130 is connected not only to the electrodes 92, 94 of the first layer 88 but also to the electrodes 96 of the second layer 90. The second sequentialization element 132 is connected not only to the electrodes 96 of the second layer 90 but also to the electrodes 92, 94 of the first layer 90. As illustrated in FIG. 7, the outputs 136 can be connected to the same electrode (here the third electrode 96). In such a constellation of the first and the second sequentialization element 130, 132, the sensor cells 74 can be "bridged". Therefore a direct connection between the outputs 136 of the first sequentialization element 130 and the second sequentialization element 132 can be established.

Such a "short circuit" can be determined by measurement by an evaluation unit which is connected to the first and the second terminal 126, 128. If the first and the second sequentialization element 130, 132 are correctly connected, the evaluation unit can determine the corresponding short circuit between the first terminal 126 and the second terminal 128. In order to self-test the sequentialization elements 130, 132, the sequentialization elements are short-circuited at intervals and the short circuit is tested by the evaluation unit. Thereby, the functionality of the sequentialization elements 130, 132 as part of the signal-processing chain of the sensor can be continuously verified.

FIG. 8 shows a particularly preferred exemplary embodiment for contacting the matrix-like sensor 66. In the exemplary embodiment according to FIG. 8, nine sensor cells 74 are connected to an evaluation unit 46 by a first sequentialization element 130 and a second sequentialization element 132. In addition to the first, second and third electrodes 92, 94, 96, the circuit arrangement 125 has three further electrodes 142, 144, 146 which contact the further sensor cells 74. As in the exemplary embodiment above, all of the electrodes 92, 94, 96, 142, 144, 146 are each connected to the inputs 134 of the first and the second sequentialization element 130, 132. This way, not only each of the two electrodes of a sensor cell 74 can be connected to the outputs 136, but also a direct connection in the abovementioned manner can produced.

In the exemplary embodiment according to FIG. 8, the output 136 of the second sequentialization element 132 is connected to an electrical ground terminal 150 by a first resistor 148. The output 136 of the first sequentialization element 130 is on the one hand connected to a voltage source 154 by a second resistor 152 and on the other hand the output 136 of the first sequentialization element 130 is connected to an analog/digital converter (ADC) 156 of the evaluation unit 46. Thereby a voltage divider is being formed between the second resistor 152 and the first resistor 148 or between the second resistor 152 and the sum of the second resistor 152 and the resistor 129 of the sensor cells 74 to which the first and the second sequentialization element 130, 132 are connected. In other words, when the first sequentialization element 130 and the second sequentialization element 132 are "short-circuited", a defined voltage is established at the analog/digital converter 156, the said defined voltage being produced by the voltage divider of the first and the second resistor 148, 152 and the voltage of the voltage source 154. Secondly, the specific resistance 129 of a sensor cell 74 can easily be determined from the deviation from this expected value.

In this way, it is particularly easy to determine by the evaluation unit 46 the instantaneous resistance of a sensor cell 74 and therefore the corresponding pressure load on a sensor cell 74. Furthermore, the addressing of the sequentialization elements 130, 132 can be tested in a simple manner. Additional devices for monitoring the sequentialization elements 130, 132 are not required.

Furthermore, the analog/digital converter 156 may be tested for correct operation if the first resistor 148 and the second resistor 152 are each adjustable. Owing to the variable voltage divider which is present when the first and the second sequentialization element 130, 132 are connected to the same electrode, the entire region of the analog/digital converter 156 can be made verifiable. The results of the evaluation of the sensor cells 74 and also the results of the monitoring of the sequentialization elements and/or of the analog/digital converter 156 can be transferred to a superordinate control unit for further processing.

In one exemplary embodiment, the evaluation unit 46 can be an OSSD, that is the output signal is an OSSD signal which can indicate a first state and a second state. Preferably, the signal is a redundant clock signal with two components which are not synchronized with one another. The first state indicates a safe state of the sensor, i.e. a state in which a sensor cell 74 is not subjected to a load and no fault has been identified in either of the sequentialization elements 130, 132 or the analog/digital converter 156. The first state is actively signalled, that is to say the redundant signal has to be present in this state. The second state is signalled by there being no redundant clock signal and indicates that either a sensor cell 74 has been subjected to loading or there is a fault in the sequentialization elements 130, 132 or the analog/digital converter 156.

In another exemplary embodiment, the output signal from the evaluation unit 46 contains an encoded signal which contains information about which sensor cell 74 is subjected to loading or which sensor cell 74 is not subjected to loading. Similarly, the results of the self-test of the sequentialization elements 130, 132 and of the analog/digital converter 156 can be transmitted to a safety system, so that on the on hand an evaluation if the sensor 66 has been touched can be performed and on the other hand a diagnosis report which indicates the functionality of the sensor 66 and the signal processing thereof can be generated.

There are also intermediate configurations between the last two exemplary embodiments conceivable, for example an OSSD signal that is being provided by the evaluation unit and diagnosis data that is being provided by a second output at the same time. It goes without saying that the exemplary embodiment according to FIG. 8 can be extended to any desired number of sensor cells 74 and the disclosure is not limited to the nine sensor cells shown.

FIG. 9 is a perspective illustration of the rear side of a preferred exemplary embodiment of the novel safety mat. The rear side 160 of the safety mat corresponds to the bottom side of the supporting body 48. The rear side 160 substantially has a planar surface 162 into which structures are incorporated in order to enable the connection of the electronics which are situated inside the supporting body 48. The structures are incorporated into the planar surface 162, for example, by a surface milling process, or are formed directly during production of the supporting body 48, for example during injection-moulding.

In the exemplary embodiment according to FIG. 9, the structures have a passage opening 164, a first, second, third and fourth cable guide 166, 168, 170, 172 and also sockets 174a, 174b in the form of hollows in the rear side 160. The passage opening 164 is an opening which is perpendicular to the planar surface 162, preferably in the form of a bore, which extends through the supporting body 48. A connection to electronics, such as the evaluation unit of the safety mat for example, which are arranged within the supporting body 48 can be established through the passage opening 164. In a preferred exemplary embodiment, a cable, not illustrated here, is guided through the passage opening 164. The cable is preferably a multicore cable with a protective sheathing. As an alternative, it is also feasible to use a prefabricated cable harness.

The cable is preferably fixed in the passage opening 164 and the passage opening 164 is otherwise sealed in a dust- and water-tight manner by a seal or filling, so that a high International Protection Marking, for example in line with IP67, can be ensured. Owing to the fixing, that part of the cable which exits from the supporting body 48 out of the passage opening 164 has a defined, fixed length, and a plug connector is arranged at the end of the said cable. The plug connector is preferably a multipole round plug connector of type M5, M8 or M12. In a preferred exemplary embodiment, the plug connector has a screw-locking arrangement in line with DIN EN 61076-2-104 or a snap-locking arrangement. The plug connector can have an IP65/IP67 protection marking, for example by the plug connector being moulded on the cable. The plug connector is particularly preferably arranged in a metal housing which has 360° EMC-proof shielding in order to ensure a high degree of reliability for signal transmission.

The sockets 174a, 174b form receptacles for the plug connector. The shape of a socket 174a, 174b is matched to the shape of a plug connector. A socket 174a, 174b is preferably an elongate hollow with a semicircular cross section into which a round plug connector can be clipped, so that the plug connector is held in the hollow. The sockets 174a, 174b open on one side into a cavity 176a, 176b in the side faces 52a, 52b and merge on the opposite side with one of the cable guides 166, 168, 170, 172. In each case two sockets 174a, 174b are particularly preferably arranged in the manner of a cross in relation to one another in a corner region in which the first and the second side faces 52a, 52b meet. The distances by which the cavities 176a, 176b of the two sockets 174a, 174b are remote from the abutment edge 178 of the two side faces 52a, 52b are preferably the same, so that the cavities 176a, 176b of two adjacent safety mats are located opposite to one another when the safety mats abut flush one against the other. In a preferred exemplary embodiment with a cuboidal supporting body, intersecting sockets are arranged in all four corners with cavities in each case at a fixed distance from the side edges of the cuboidal supporting body. This way, the safety mats can be combined with one another in a particularly flexible manner and joined to form a multi component assembly.

The sockets 174a, 174b are connected to the passage opening 164 by cable guides 166, 168, 170, 172. In the exemplary embodiment according to FIG. 9, the passage opening 164 is arranged centrally with respect to an end side 180 of the safety mat. Here, two sockets 174a are arranged with a first orientation in which the cavities 176a of the sockets 174a lie in the side faces 52a, wherein two further sockets 174b are arranged with a second orientation, so that the cavities 176b of the said further sockets lie in the side faces 52b. The first and the second orientation are preferably at an angle of 90° in relation to one another when the supporting body 48 is rectangular. The transitions 182a, 182b from the sockets 174a, 174b to the cable guides 166, 168, 170, 174 are arranged at a first and a second distance from the passage opening 164, wherein the first distance and the second distance are different. An edge is formed at the transitions 182a, 182b, so that a plug connector which is inserted into the sockets 174a, 174b cannot slide into the cable guides.

A cable which emerges from the passage opening 164 can be inserted into the cable guides 166, 168, 170, 172. The cable guides 166, 168, 170, 172 form channels in the planar surface 162 which run from the passage opening 164 to the transitions 182a, 182b. The channel walls are rounded, wherein the rounded portion is designed such that a surface of the cable bears at least partially flush against the channel walls. The depth of the channels is designed such that a cable can be completely inserted into the channels and therefore does not protrude from the planar surface 162. The channels preferably have a barrel-like profile in cross section. In another exemplary embodiment, the profile is U-shaped, wherein the lower corners are rounded.

In one exemplary embodiment, the channels have a length which corresponds to the defined length of the cable which emerges from the passage opening 164. The channels of the individual cable guides 166, 168, 170, 172 are preferably of equal length. The profile of the cable guides 166, 168, 170, 172 is curved with large radii of curvature and does not have any corners. The profile is free of kinks. The radii are preferably greater than 10 cm. In the exemplary embodiment according to FIG. 9, the curved profile of a cable guide 166, 168, 170, 172 is made up of different sections. The sections can be straight or bent sections. Transition bends are preferably arranged between the sections, which are configured such that a curve in the transition from a straight section to an arcuate section becomes narrower only slowly and not suddenly. The curved profile makes it possible for even stiff cables which exhibit a low degree of flexibility to be uniformly inserted into the cable guides and therefore securely fitted. In particular, the risk of a core snapping or a plurality of cores being squashed such that a cross-connection is formed when the cables are kinked is reduced.

In one exemplary embodiment, the cable is laid in the cable guides 166, 168, 170, 172 without play. In another preferred exemplary embodiment, the channels have at least one first section 184 and one second section 186. A cable can be laid without play in the first section 184. In the second section 186 a compression space is formed by the cable guide widening in this region. The defined width of the cable guides in the first region of the second section 186 preferably uniformly increases and, in an adjoining second section, continuously decreases again down to the defined width of the first section 184. The compression space 186 is designed to lay a cable without play in order to compensate for slight variations in the cable length. The combination of sections with compression spaces 186 and sections 184 with accurately fitting cable guidance allows effective fixing of the cable in the channels, wherein a certain degree of flexibility in respect of the cable length is provided by the compression spaces 184 at the same time.

Flexibility during cable guidance is important when, in one exemplary embodiment, the sockets 174a, 174b have further structures for fixing the plug connectors in different positions. For example, it is conceivable for the plug connector to be able to be arranged within the socket 174a, 174b in a first and a second position, wherein the plug connector terminates flush with the side face 52 in the first position, and the plug connector extends beyond the side face 52 or comes to lie further in the interior of the supporting body 48 and therefore does not terminate flush with the side faces in the second position. The cable to the plug connector has to be longer or shorter in the second position than in the first position. This variation in length can be achieved by the compression spaces 186.

It goes without saying that the design of the rear side is not limited to the exemplary embodiments shown here. In particular, in other exemplary embodiments the passage opening 164 can also be arranged in an eccentric manner. Similarly, further passage openings can be provided with further cable guides and also passage openings can be provided with a plurality of cables in order to provide the further side faces with connection options. In a preferred exemplary embodiment, an output signal from the evaluation unit of the safety mat is supplied via a first passage opening 164 and an input or control signal is received via a further passage opening. Signals can particularly preferably be looped through from one passage opening, via the evaluation unit, to a further passage opening. An assembly of multiple safety mats, which are connected in series, can be formed particularly effectively in this way.

What is claimed is:

1. A safety mat for safeguarding a technical installation, comprising a sensor, a rigid supporting body and an evaluation unit,
    wherein the sensor has an active sensor area and a flexible connection region for contacting the sensor area, the flexible connection region being formed at a border of the active sensor area,
    wherein the supporting body has a base with a top side and a first side face which adjoins the said top side,
    wherein the evaluation unit is arranged in the interior of the supporting body below the active sensor area and is configured to generate an output signal depending on the actuation of the active sensor area,
    wherein the active sensor area completely covers the top side of the base of the supporting body, and
    wherein the connection region of the sensor is folded by an angle of at least 90° around the first side face and guided into the interior of the supporting body.

2. The safety mat according to claim 1, wherein cavities are provided in the connection region and the first side face has a profile with groove-like cavities, and further
    wherein the cavities engage in the profile when the connection region is folded around the first side face.

3. The safety mat according to claim 1, wherein the active sensor surface is produced from a flexible material, and the connection region is an extension of the active sensor surface, the extension being composed of the same material.

4. The safety mat according to claim 1, wherein the sensor has a first layer with electrodes in a first orientation, a second layer with electrodes in a second orientation, and a third layer which is situated between the first and the second layer.

5. The safety mat according to claim 4, wherein the first and the second layers each comprise a flexible woven fabric into which the electrodes are woven with conductive yarn.

6. The safety mat according to claim 4, wherein the third layer is formed from flexible, conductive material which, under local loading, changes its specific electrical resistance at the site of the loading.

7. The safety mat according to claim 4, wherein the connection region is subdivided into a first and a second region and the base has a further side face, and further
    wherein the first region is folded around the first side face, and the second region is folded around the further side face.

8. The safety mat according to claim 7, wherein the electrodes of the first layer are extended into the first region, and the electrodes of the second layer are extended into the second region.

9. The safety mat according to claim 4, wherein the connection region is formed only on one side of the active sensor surface, and the electrodes of the first layer and of the second layer are guided into the connection region.

10. The safety mat according to claim 9, wherein the first layer has intermediate regions, which space apart the electrodes from one another, and further conductive paths with the first orientation, the conductive paths being arranged in the intermediate regions and contacting the electrodes of the second layer, and further wherein the electrodes of the first layer and the further conductive paths are guided into the connection region.

11. The safety mat according to claim 1, wherein the active sensor surface is larger than 0.25 m².

12. The safety mat according to claim 11, wherein the active sensor surface is between 0.25 m² and 1 m².

13. The safety mat according to claim 1, wherein the connection region is folded around the first side face with a radius of from 0.5 cm to 1 cm.

14. The safety mat according to claim 1, wherein the safety mat further has a cover plate on which the active sensor face is arranged, and further
wherein the cover plate is arranged on the supporting body in a releasable manner, in order to allow access to the evaluation unit.

* * * * *